(12) United States Patent
Breen et al.

(10) Patent No.: US 12,402,396 B2
(45) Date of Patent: *Aug. 26, 2025

(54) MODULAR GUIDED KEEPER BASE

(71) Applicant: STANDARD LIFTERS, INC., Grand Rapids, MI (US)

(72) Inventors: Scott M. Breen, Ada, MI (US); Joel T. Pyper, Holland, MI (US)

(73) Assignee: STANDARD LIFTERS, INC., Grand Rapids, MI (US)

( * ) Notice: Subject to any disclaimer, the term of this patent is extended or adjusted under 35 U.S.C. 154(b) by 337 days.

This patent is subject to a terminal disclaimer.

(21) Appl. No.: 17/990,873

(22) Filed: Nov. 21, 2022

(65) Prior Publication Data

US 2023/0084734 A1 Mar. 16, 2023

Related U.S. Application Data

(63) Continuation-in-part of application No. 17/749,216, filed on May 20, 2022, now Pat. No. 11,571,730, (Continued)

(51) Int. Cl.
*H10D 84/40* (2025.01)
*H01L 21/324* (2006.01)
(Continued)

(52) U.S. Cl.
CPC ......... *H10D 84/401* (2025.01); *H01L 21/324* (2013.01); *H10D 10/40* (2025.01);
(Continued)

(58) Field of Classification Search
CPC ........ B21D 37/02; B21D 37/04; B21D 37/10; B21D 37/12; B21D 37/14; B21D 37/142; B30B 15/02; B30B 15/026
(Continued)

(56) References Cited

U.S. PATENT DOCUMENTS 2,346,297 A 4/1944 Garbe
2,487,233 A 11/1949 Gerke
(Continued)

OTHER PUBLICATIONS

Tapered_snap_ring_groove_Clm_1_10_.pdf (https://docplayer.net/48771795-Rotor-clip-retaining-rings-made-to-world-standards-inch-din-metric-ansi-metric-jis-japanese-industrial-standard.html) (website accessed Sep. 24, 2021) (Year: 2017).

(Continued)

*Primary Examiner* — Adam J Eiseman
*Assistant Examiner* — Fred C Hammers
(74) *Attorney, Agent, or Firm* — PRICE HENEVELD LLP

(57) ABSTRACT

A modular guided keeper base, guided keeper assembly, and related method includes a modular guided keeper base that mounts to a die member. The guided keeper base has an integrated stop for guide pin retention. The guided keeper base can also accommodate a variety of bushings within the base. The guided keeper base is attached to a die member using a mounting flange(s). Mounting fasteners pass through the fastener holes in the mounting flanges and are anchored in the die member to securely retain the guided keeper assembly in place. A retainer ring is mounted in an associated groove in the base over the heads of the mounting fasteners to prevent unintentional unfastening of the fasteners from the die member.

20 Claims, 13 Drawing Sheets

Related U.S. Application Data which is a continuation of application No. 17/009,186, filed on Sep. 1, 2020, now Pat. No. 11,344,943.

(51) Int. Cl.
*H10D 10/40* (2025.01)
*H10D 62/83* (2025.01)
*H10D 64/62* (2025.01)
*H10D 84/01* (2025.01)
*H10D 84/03* (2025.01)

(52) U.S. Cl.
CPC ............ *H10D 62/83* (2025.01); *H10D 64/62* (2025.01); *H10D 84/0109* (2025.01); *H10D 84/038* (2025.01)

(58) Field of Classification Search
USPC .......................................................... 72/456
See application file for complete search history.

(56) References Cited

U.S. PATENT DOCUMENTS

| | | |
|---|---|---|
| 2,627,313 A | 2/1953 | Marsilius |
| 2,629,615 A | 2/1953 | Marsilius |
| 2,663,180 A | 12/1953 | Benedict |
| 2,979,004 A | 4/1961 | Kenville et al. |
| 3,386,781 A | 6/1968 | Blazek et al. |
| 3,474,656 A | 10/1969 | Kraft |
| 3,514,166 A | 5/1970 | Coley |
| 3,568,555 A | 3/1971 | Stroh |
| 3,664,258 A | 5/1972 | Vecchi |
| 3,730,039 A | 5/1973 | Fedrigo |
| 3,897,118 A | 7/1975 | Wolfthal |
| 4,003,283 A | 1/1977 | Janiszewski |
| 4,080,819 A | 3/1978 | Hook et al. |
| 4,135,770 A | 1/1979 | Doherty et al. |
| 4,199,313 A | 4/1980 | Bohnenberger |
| 4,282,736 A | 8/1981 | Mashburn |
| 4,326,402 A | 4/1982 | Wallis |
| 4,483,173 A | 11/1984 | Duhamel |
| 4,696,180 A | 9/1987 | Zandel |
| 4,732,033 A | 3/1988 | Smedberg et al. |
| 4,742,746 A | 5/1988 | Olsson |
| 4,765,227 A | 8/1988 | Balazs et al. |
| 4,796,460 A | 1/1989 | Smedberg et al. |
| 4,836,071 A | 6/1989 | Ersoy |
| 5,113,736 A | 5/1992 | Meyerle |
| 5,243,743 A | 9/1993 | Peterson |
| 5,245,904 A | 9/1993 | Meyerle |
| 5,722,280 A | 3/1998 | Bodnar |
| 5,775,212 A | 7/1998 | Takao |
| 5,788,903 A | 8/1998 | Allgaier |
| 5,974,852 A | 11/1999 | Nieschulz |
| 6,408,728 B1 | 6/2002 | Tsuji et al. |
| 6,848,290 B2 | 2/2005 | Pyper et al. |
| 6,895,797 B2 | 5/2005 | Lowry et al. |
| 6,925,922 B2 | 8/2005 | Manabe et al. |
| 6,986,273 B2 | 1/2006 | Rager |
| 7,000,446 B2 | 2/2006 | Nieschulz et al. |
| 7,004,007 B2 | 2/2006 | Kruger et al. |
| 7,114,365 B2 | 10/2006 | Rooney, Jr. et al. |
| 7,152,451 B1 | 12/2006 | Cotter |
| 7,730,757 B2 | 6/2010 | Pyper et al. |
| 7,861,569 B2 | 1/2011 | Cotter et al. |
| 7,950,262 B2 | 5/2011 | Pyper et al. |
| 8,074,486 B1 | 12/2011 | Pyper et al. |
| 8,151,619 B2 | 4/2012 | Pyper et al. |
| 8,522,595 B2 | 9/2013 | Pyper et al. |
| 8,910,502 B2 | 12/2014 | Breen et al. |
| 8,919,178 B2 | 12/2014 | Breen et al. |
| 9,221,092 B2 | 12/2015 | Pyper et al. |
| 9,248,491 B2 | 2/2016 | Breen et al. |
| 9,254,515 B2 | 2/2016 | Breen et al. |
| 9,272,321 B2 | 3/2016 | Breen et al. |
| 10,035,180 B2 | 7/2018 | Breen et al. |
| 10,046,376 B2 | 8/2018 | Breen et al. |
| 10,265,757 B2 | 4/2019 | Pyper et al. |
| 10,343,205 B2 | 7/2019 | Breen et al. |
| 10,343,206 B2 | 7/2019 | Breen et al. |
| 11,344,943 B2 * | 5/2022 | Breen .................... B21D 37/12 |
| 11,571,730 B2 * | 2/2023 | Breen .................... B21D 37/02 |
| 2002/0124706 A1 | 9/2002 | Mochizuki |
| 2005/0045786 A1 | 3/2005 | Tupper et al. |
| 2005/0095062 A1 | 5/2005 | Iverson et al. |
| 2007/0037434 A1 | 2/2007 | Fedder et al. |
| 2008/0295315 A1 | 12/2008 | Horng |
| 2009/0193865 A1 | 8/2009 | Pyper et al. |
| 2009/0308242 A1 | 12/2009 | Choi et al. |
| 2009/0309324 A1 | 12/2009 | Comunello |
| 2011/0302988 A1 | 12/2011 | Breen et al. |
| 2012/0055224 A1 | 3/2012 | Breen et al. |
| 2012/0210766 A1 | 8/2012 | Breen et al. |
| 2016/0082499 A1 | 3/2016 | Pyper et al. |
| 2019/0210086 A1 | 7/2019 | Pyper et al. |
| 2021/0069769 A1 | 3/2021 | Breen et al. |

OTHER PUBLICATIONS

Split_bronze_bushing_Clm_4_6.pdf. (https://web.archive.org/web/20150522015649/https://www.national bronze.com/News/split-bronze-bearings-variations-and-applications/) (website accessed Sep. 24, 2021) (Year: 2015).

Plug_Graphite_Bearings_Clm_5_.pdf (https://web.archive.org/web/20130228154123/http://www.nationalbronze.com/plug-graphite-bearings.php) (website accessed Sep. 24, 2021) (Year: 2013).

* cited by examiner

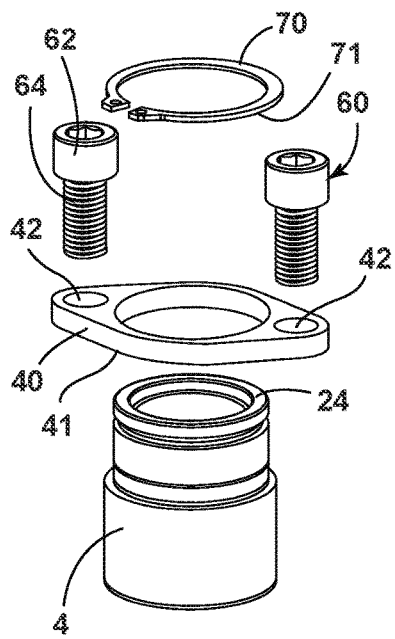 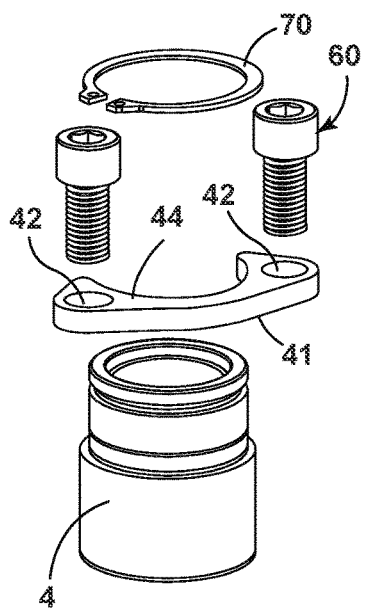 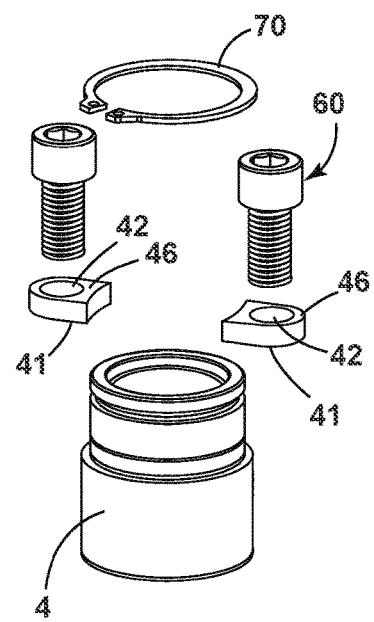
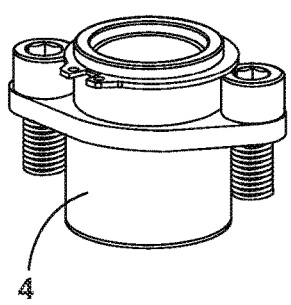 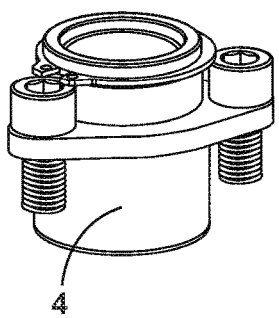 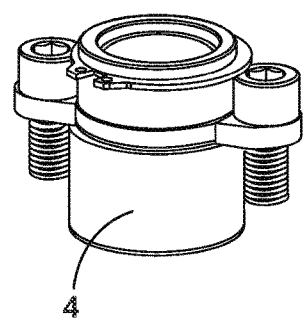
FIG. 8　　　FIG. 9　　　FIG. 10

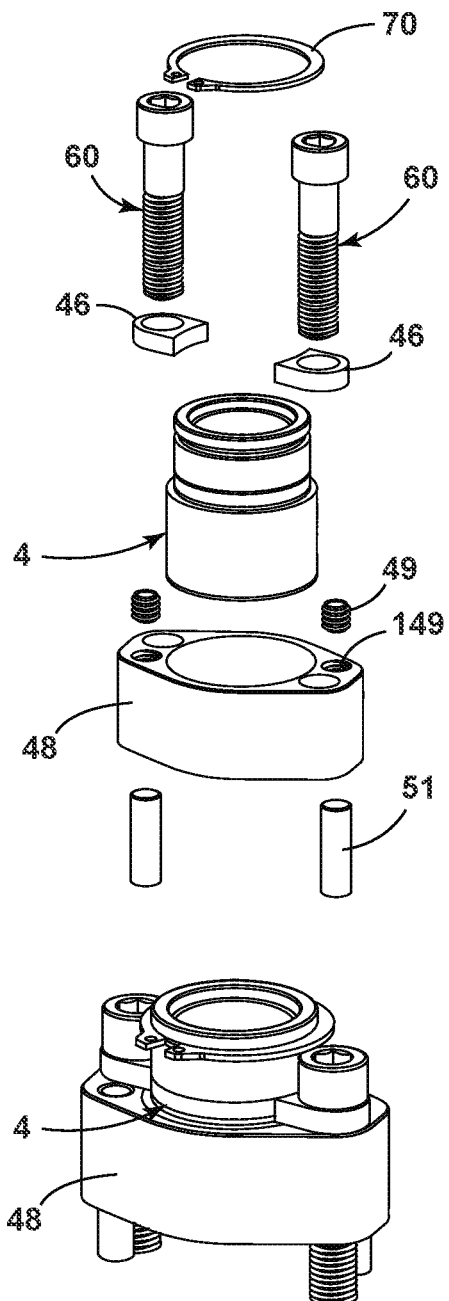
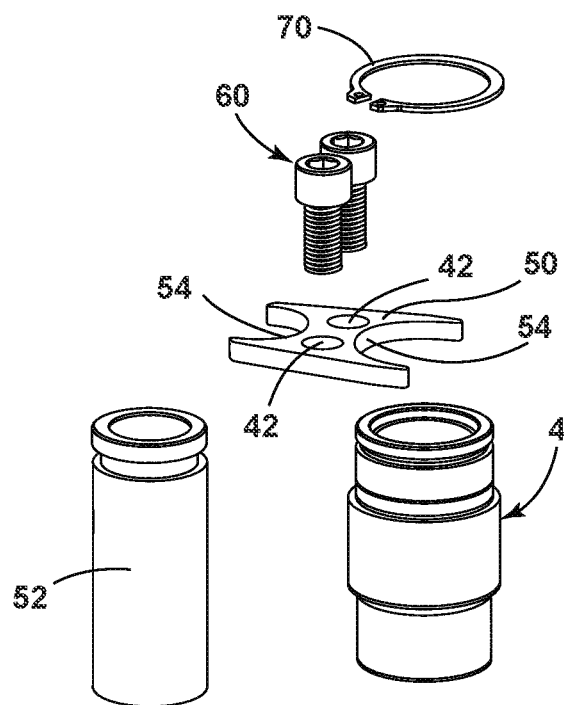
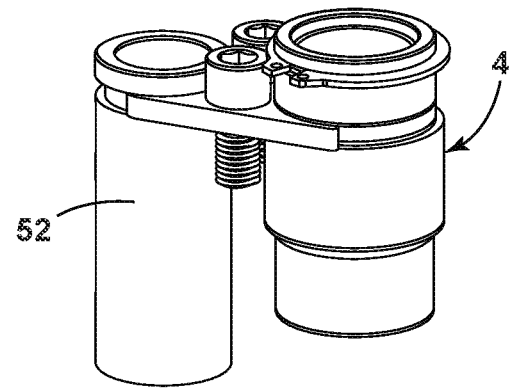
FIG. 11
FIG. 12

MODULAR GUIDED KEEPER BASE

CROSS REFERENCE TO RELATED APPLICATIONS

The present application is a continuation-in-part of and claims priority under 35 U.S.C. § 120 to commonly assigned U.S. Pat. No. 11,571,730 issued Feb. 7, 2023, entitled MODULAR GUIDED KEEPER BASE, which is a continuation of and claims priority under 35 U.S.C. § 120 to commonly assigned U.S. Pat. No. 11,344,943 issued May 31, 2022, entitled MODULAR GUIDED KEEPER BASE, which claims the priority benefits under the provisions of 35 U.S.C. § 119, basing said claim of priority on related U.S. Provisional Application No. 62/896,281 filed Sep. 5, 2019, which is incorporated in its entirety herein by reference.

BACKGROUND OF THE INVENTION

The present invention relates to metal forming dies, and particularly to a modular guided keeper base and associated methods.

Metal forming dies, such as stamping dies and the like are well known in the art. Pro-gressive metal forming dies are unique, very sophisticated mechanisms which have multiple stations or progressions that are aligned longitudinally, and are designed to perform a specified operation at each station in a predetermined sequence to create a finished metal part. Progres-sive stamping dies are capable of forming complex metal parts at very high speeds, so as to minimize manufacturing costs.

Heretofore, the dies used in metal forming presses have typically been individually designed, one of a kind assemblies for a particular part, with each of the various components being handcrafted and custom mounted or fitted in an associated die set, which is in turn positioned in a stamping press. Not only are the punches and other forming tools in the die set individually designed and constructed, but the other parts of the die set, such as stock lifters, guides, end caps and keepers, cam returns, etc., are also custom designed and individually installed in the die set. Current die making processes require careful machining, precision holes and recesses in the die set for mounting the individual components, such that the same are quite labor intensive, and require substantial lead time to make, test and set up in a stamping press. Consequently, such metal forming dies are very expensive to design, manufacture and repair or modify.

A modular guided keeper base that can accommodate many mounting and bushing options with integrated solid stops for guide pin retention would be clearly advantageous in simplifying metal forming die constructions and reducing the costs in designing, manufacturing and repairing the same.

SUMMARY OF THE INVENTION

One aspect of the present invention is a guided keeper assembly for metal forming die having first and second die members mounted a spaced apart distance for reciprocation between converged and diverged positions. The guided keeper assembly includes a base that has a generally cylindrical first portion with a first outside diameter and a generally cylindrical second portion with a second outside diameter. The second outside diameter is less than the first outside diameter creating an external shoulder on the base where the first portion and the second portion intersect. The base has a tapered retainer ring groove on the exterior surface of the second portion. The base also has an aperture extending axially into a central portion of the base with an internal shoulder in the aperture. The guided keeper assembly also includes at least one bushing, with a first end portion and a second end portion, that is positioned within the aperture in the base. The guided keeper assembly also includes a guide pin having a cylindrically shaped central portion that is closely received within the at least one bushing. The guide pin has a first end having an enlarged head to abut the base to positively limit travel between the first and second die members. The guide pin also has a second end that couples to one of the die members. The guided keeper assembly also includes a mounting flange member that includes at least one fastener opening. The mounting flange member abuts at least a portion of the external shoulder of the base. At least one fastener is received through the at least one fastener opening in the mounting flange to couple the base to the other die member. A retainer ring is detachably received and securely retained in the retainer ring groove within the base such that an interior face of the retainer ring is disposed over at least a portion of the at least one fastener to positively prevent the fastener from unintentionally unfastening from the other die member.

Another aspect of the present invention is a guided keeper assembly with a base having a generally cylindrical first portion with a first outside diameter and a generally cylindrical second portion with a second outside diameter. The second outside diameter is less than the first outside diameter creating a first external shoulder on the base. The base also includes a tapered retaining ring groove on the exterior surface of the second portion, with the retainer ring groove including a taper in the groove with a portion that tapers toward the first portion of the base and a generally cylindrical portion. The base also includes an aperture extending into a central portion of the base with an internal shoulder. The guided keeper assembly also includes a bushing member with a first end portion and a second end portion in the aperture in the base. The guided keeper assembly also includes a guide pin with a cylindrically shaped central portion that is closely received in the bushing member. The guide pin also has a first end with an enlarged head and a second end positioned opposite the first end. The guided keeper assembly includes a mounting flange member that has at least one fastener opening, with the mounting flange member abutting at least a portion of the first external shoulder on the base. The guided keeper assembly includes at least one fastener that is received through the one fastener opening in the mounting flange member. A retaining ring is detachably received in the retainer ring groove of the base such that the retainer ring is disposed over the at least one fastener.

Yet another aspect of the present invention is a method of making a guided keeper assembly. The method includes forming a base with a generally cylindrical first portion with the first outside diameter and a generally cylindrical second portion with a second outside diameter which is less than the first outside diameter creating an external shoulder where the first portion and the second portion intersect. The method also includes forming an aperture into a central portion of the base with an internal shoulder. The method includes forming a tapered retaining ring groove on an exterior surface of the second portion of the base. At least one bushing is inserted into the aperture in the base. The method includes forming a guide pin with a cylindrically shaped central portion for close reception in the at least one bushing, with the guide pin including a first end with an enlarged head to abut the base and a second end. The guide pin is inserted into the at least one bushing. A mounting flange member having at least one fastener opening is positioned against at least a portion of the external shoulder. At least one fastener is positioned in the at least one fastener opening in the mounting flange. A retainer ring is inserted into the retainer ring groove to be disposed over the at least one fastener.

These and other advantages of the invention will be further understood and appreciated by those skilled in the art by reference to the following written specification, claims, and appended drawings.

BRIEF DESCRIPTION OF THE DRAWINGS

FIG. 8 is a perspective view of a base with one embodiment of a mounting flange member;

FIG. 9 is a perspective view of a base with another embodiment of a mounting flange member;

FIG. 10 is a perspective view of a base with another embodiment of a mounting flange member;

FIG. 11 is a perspective view of a base with another embodiment of a mounting flange member;

FIG. 12 is a perspective view of a base with another embodiment of a mounting flange member;

DETAILED DESCRIPTION OF THE PREFERRED EMBODIMENTS

For purposes of description herein, the terms "upper," "lower," "right," "left," "rear," "front," "vertical," "horizontal," and derivatives thereof shall relate to the invention as oriented in the attached drawings. However, it is to be understood that the invention may assume various alternative orientations and step sequences, except where expressly specified to the contrary. It is also to be understood that the specific devices and processes illustrated in the attached drawings, and described in the following specification, are simply exemplary embodiments of the inventive concepts defined in the appended claims. Hence, specific dimensions and other physical characteristics relating to the embodiments disclosed herein are not to be considered as limiting, unless the claims expressly state otherwise.

Figure 1:
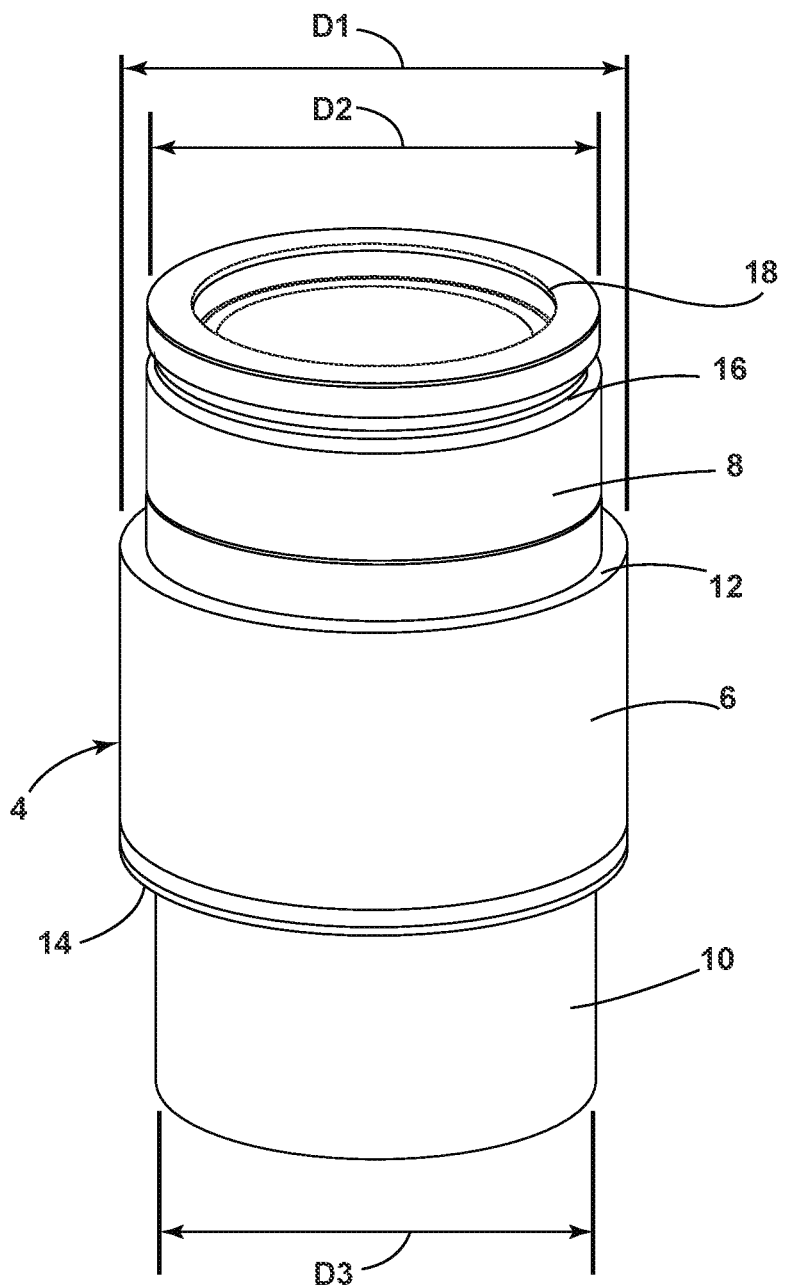
FIG. 1 is a perspective view of a base for use in a guided keeper assembly in an embodiment of the present invention.
Figure 6:
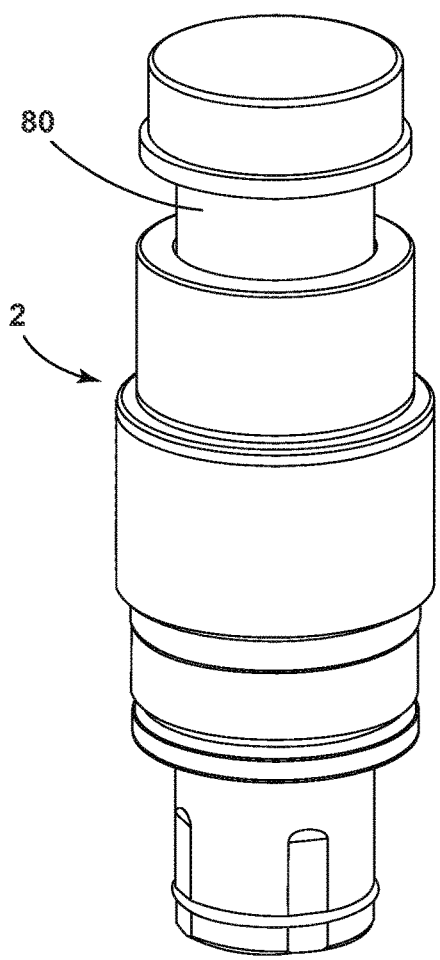
FIG. 6 is a perspective view of a guided keeper assembly of an embodiment of the present invention.
Figure 7:
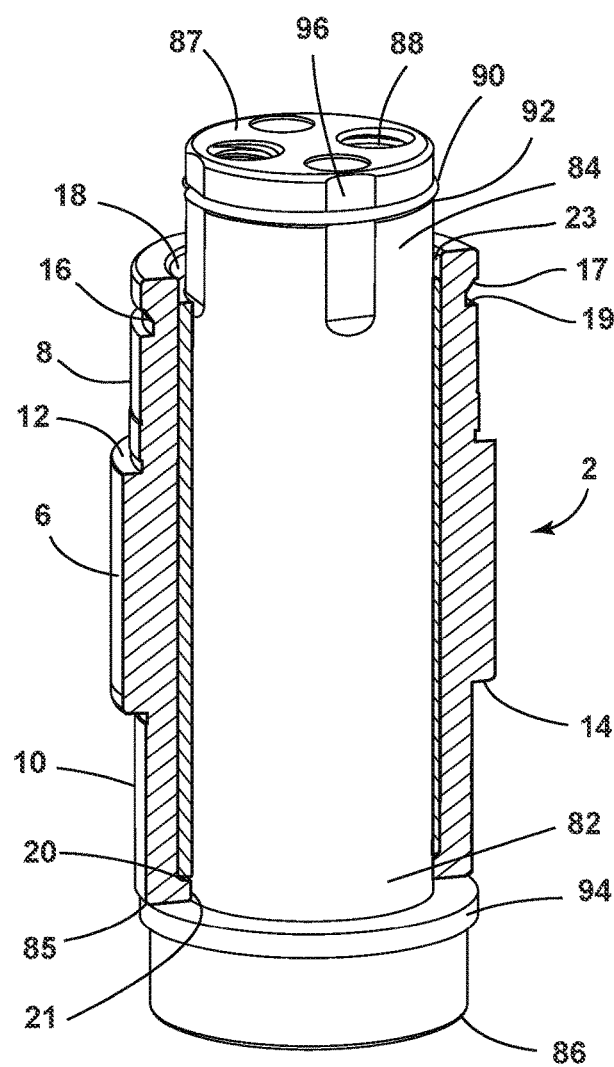
FIG. 7 is a partial, cross-sectional perspective view of the guided keeper assembly shown in FIG. 6 flipped.
Figure 16:
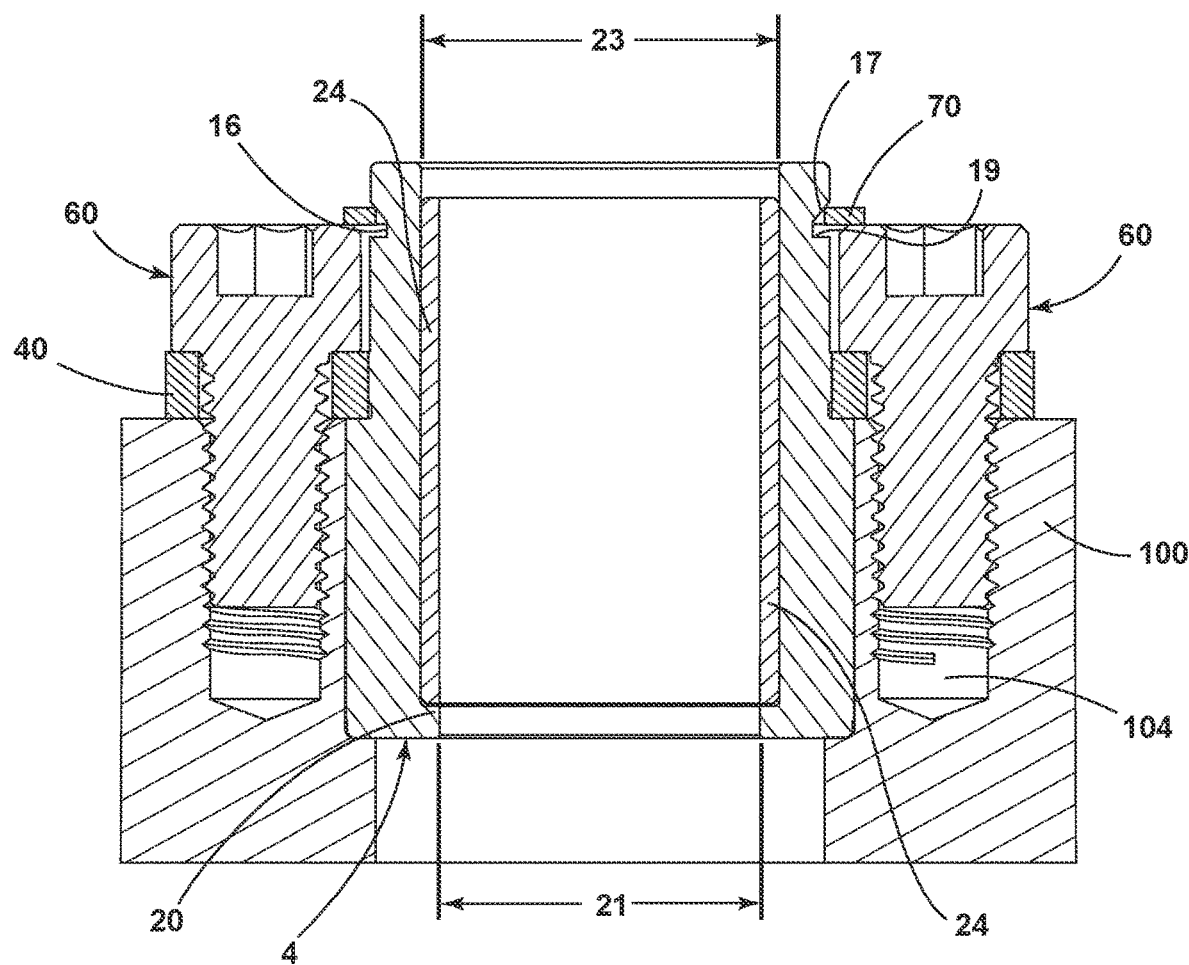
FIG. 16 is a cross-sectional view of a base installed into a die member.
Figure 18:
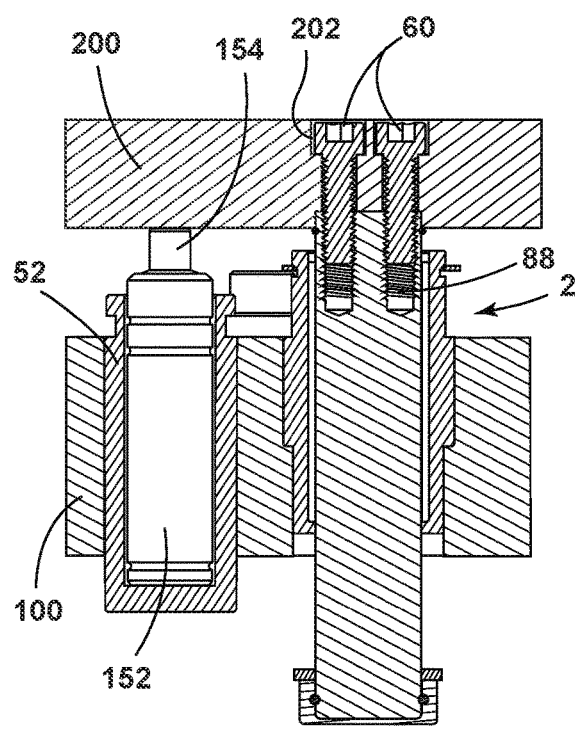
FIG. 18 is a partial, cross-sectional front view of the guided keeper assembly mounted to a gas spring can with the die members in a converged position.
Figure 19:
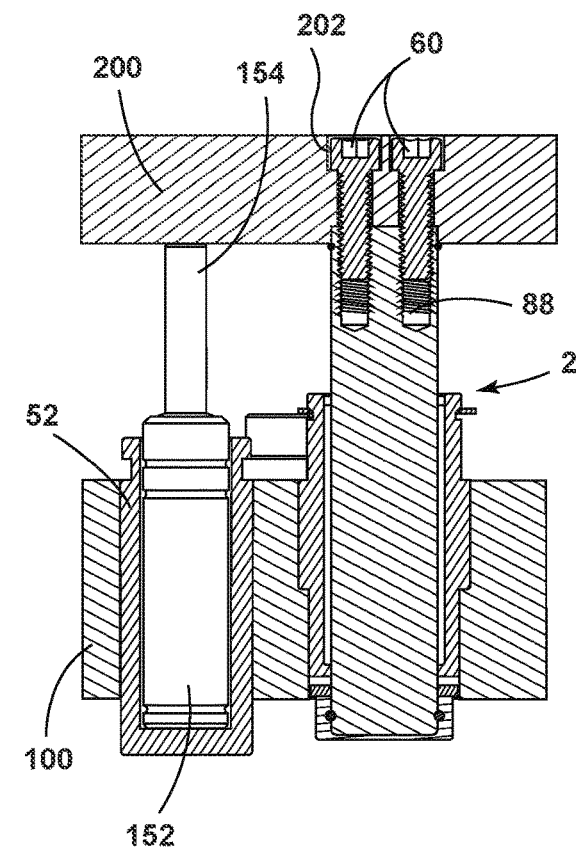
FIG. 19 is a partial, cross-sectional front view of the guided keeper assembly shown in FIG. 18 with the die members in a diverged position.
Figure 20:
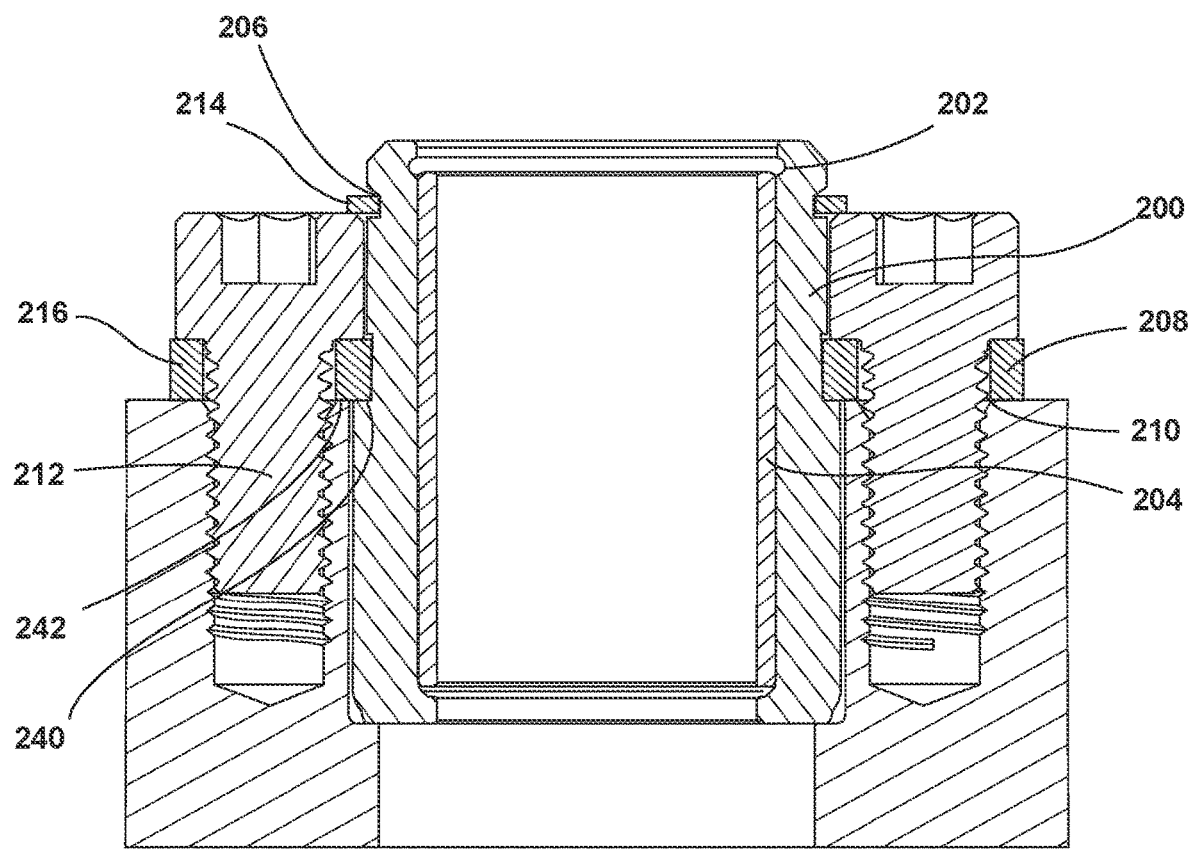
FIG. 20 is a cross-sectional view of another embodiment of a base installed into a die member.

The reference numeral 2 (FIGS. 6 and 7) generally designates a guided keeper assembly that is particularly adapted for use in conjunction with metal forming dies such, as those shown in FIGS. 18 and 19. The metal forming dies can have first and second die members 100, 200, respectively, that are mounted a spaced apart distance for reciprocation between converged and diverged positions. The guided keeper assembly 2 includes a base 4, as illustrated in FIG. 1. The base 4 includes a generally cylindrical first portion 6 with a first outside diameter D1. The base 4 also has a generally cylindrical second portion 8 with a second outside diameter D2. The second outside diameter D2 of the second portion 8 is less than the first outside diameter D1 of the first portion 6, thereby forming a first external shoulder 12 on the base 4. The base 4 can also include a generally cylindrical third portion 10 that has a third outside diameter D3 that is less than the first outside diameter D1 forming a second external shoulder 14, as illustrated in FIG. 1. The base 4 also includes a retainer ring groove 16 located on the second portion 8. The retainer ring groove 16 includes a tapered portion 17, as illustrated in FIGS. 7 and 16, and a generally cylindrical portion 19. The tapered portion 17 of retainer ring groove 16 is tapered downwardly toward the first portion 6. Base 4 also includes a centrally located aperture 18 that extends into the base 4. As illustrated in FIGS. 7 and 16, the centrally located aperture 18 can include an internal shoulder 20 which is formed by a more narrow section 21 in the centrally located aperture 18.

Figure 2:
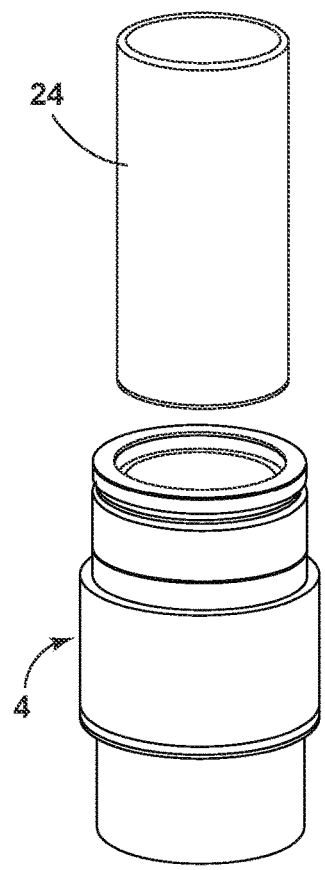
FIG. 2 is a perspective view of a bushing positioned above the base shown in FIG. 1.
Figure 3:
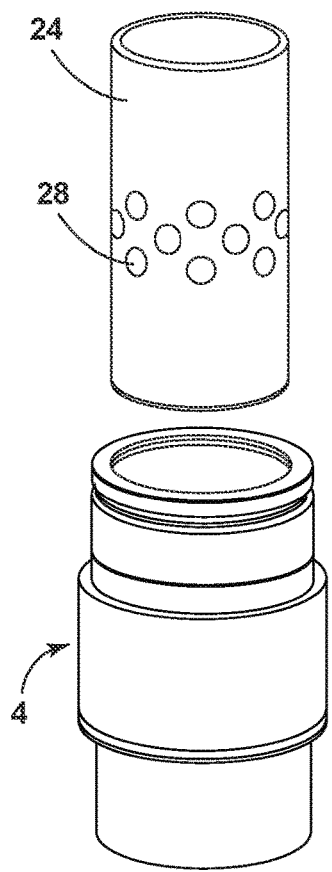
FIG. 3 is a perspective view of a bushing with graphite plugs positioned above the base shown in FIG. 1.
Figure 4:
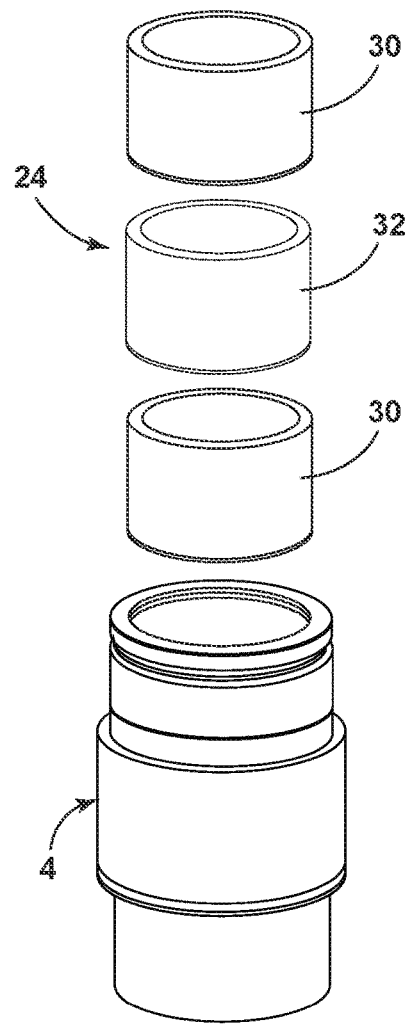
FIG. 4 is a perspective view of three bushings positioned above the base shown in FIG. 1.

The guided keeper assembly 2 can also include a bushing member 24. As illustrated in FIG. 2, the exterior diameter of bushing member 24 is approximately the same diameter as the internal diameter of the wider portion 23 of centrally located aperture 18. As illustrated in FIG. 16, the bushing member 24 can, but does not have to, rest against the internal shoulder 20 of centrally located aperture 18 in base 4. For example, there can be a gap between the bushing member 24 and the internal shoulder 20 so that the bushing member 24 does not bottom on the internal shoulder 20. The diameter of the more narrow portion 21 is approximately the same diameter as the internal diameter of the bushing member 24, as illustrated in FIG. 16. The bushing member 24 can include graphite plugs 28, as illustrated in FIG. 3. Moreover, bushing member 24 can include multiple pieces, such as bushings 30 and a coated or lubricant-filled bushing 32. For example, in FIG. 4 the bushing member 24 includes an oil-filled sintered bronze bushing 32 in between two cast bushings 30. The bushing member 24 can include any type of metallic, coated-metallic, plugged metallic, lubricant-filled bushing, polymeric bushing, multiple pieces and/or a combination thereof.

Figure 5:
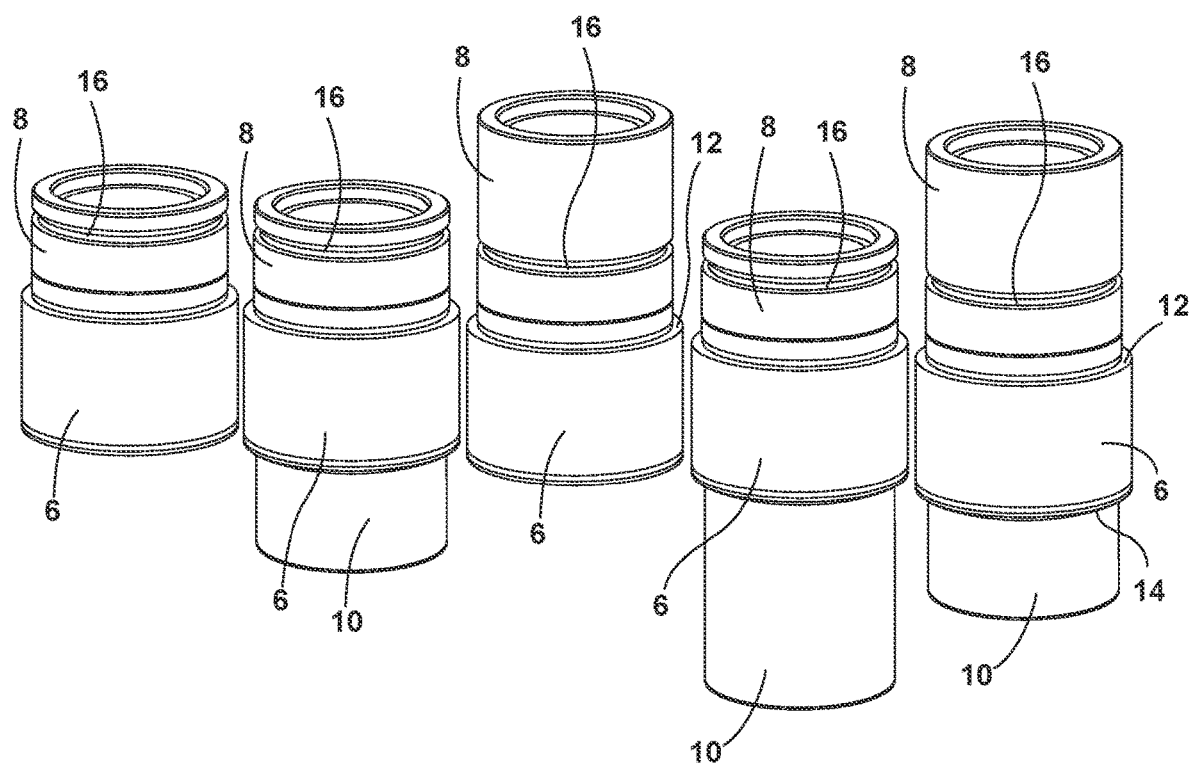
FIG. 5 is a perspective view of various-sized bases that can be used in a guided keeper assembly in different embodiments of the present invention.

The base 4 can include a variety of lengths and widths, as illustrated in FIG. 5, to accommodate different bushing lengths, different sized guide pins, different sized die members, etc. Thus, the same base 4 can be made to accommodate different bushing member 24 lengths to increase guidance and decrease premature tool wear. Moreover, the base 4 can include only a first portion 6 and second portion 8 without the third portion 10.

The guided keeper assembly 2 also includes a guide pin 80. The guide pin 80 has a first end 82 and a second end 84. An enlarged head 86 is located at the first end 82. The enlarged head 86 will abut the bottom surface 85 of the base 4. The enlarged head 86 can directly contact the bottom surface 85 of base 4 or can include a dampening member 94 therebetween. The dampening member 94 can be any type of dampening material, including, but not limited to, polymeric materials, metal materials, or combinations thereof. The guide pin 80 also includes a top surface 87 that has one or more fastener openings 88. The second end 84 of the guide pin 80 can also include a ring groove 90 for receiving a ring 92 that can abut a top surface of bushing member 24 when the guide members are converged. The second end 84 of the guide pin 80 can also include flats 96 for purposes of facilitating engagement of a tool on the guide pin 80.

A mounting flange member 40 can be used to secure the base 4 to a die member 100, as illustrated in FIG. 16. The mounting flange member 40 can be a single piece, as illustrated in FIG. 8, with fastener openings 42. The lower surface 41 of the mounting flange member 40 contacts the first external shoulder 12 of the base 4, as illustrated in FIGS. 8 and 16. This permits the installation of fasteners 60 into the fastener openings 42 of the mounting flange member 40 and into the fastener openings 104 in the die member 100, as illustrated in FIG. 16.

Another embodiment of the mounting flange member 44 is illustrated in FIG. 9. The mounting flange member 44 includes fastener openings 42 and does not cover the entirety of the external shoulder 12 when the lower surface 41 of the mounting flange member 44 is in contact with the first external shoulder 12.

Yet another embodiment of the mounting flange member 46 is illustrated in FIG. 10. The mounting flange members 46 include a single fastener opening 42. One or more of the mounting flange members 46 can be positioned at different points on the first external shoulder 12 of the base 4, as illustrated in FIG. 10. While FIG. 10 illustrates two mounting flange members 46, one or more than two can be used.

Another embodiment of the mounting flange member 48 is shown in FIG. 11. This mounting flange member 48 includes threaded members 49 that are received in openings 149 in the mounting flange member 48. Dowels 51 can be received in the underside of the opening 149. This mounting flange member 48 can be used in conjunction with mounting flange member 46, as illustrated in FIG. 11.

Another embodiment includes a mounting flange member 50, which includes two generally semi-circular regions 54 and fastener openings 42. This mounting flange member 50 permits the connection of the base 4 to another generally cylindrical object in the metal forming die. In the illustrated example, the other generally cylindrical die member 52 is a gas spring can that houses a gas spring 154, as illustrated in FIGS. 12, 18, and 19.

While these different embodiments of the mounting flange members 40, 44, 46, 48, 50 are illustrated, other mounting flanges can be used that will be of varying shapes, thicknesses, and sizes to attach the base 4 to the die member 100.

A retainer ring 70 is inserted into retainer ring groove 16. The tapered portion 17 of the retainer ring groove 16 forces the retainer ring 70 down on the fasteners 60 to keep the fasteners 60 from loosening. Once the retainer ring 70 is fully installed into the retainer ring groove 16, the interior surface 71 of the retainer ring 70 will be disposed above and contact the top surface of the fastener 60, as illustrated in FIG. 16. This prevents the fastener 60 from unintentionally becoming unsecured from the die member 100. The retainer ring 70 can be a traditional metal retainer ring or any other clip or ring that can be positioned within the retainer ring groove 16 to contact the top surface of the fasteners 60 to prevent the fasteners 60 from loosening.

Figure 13:
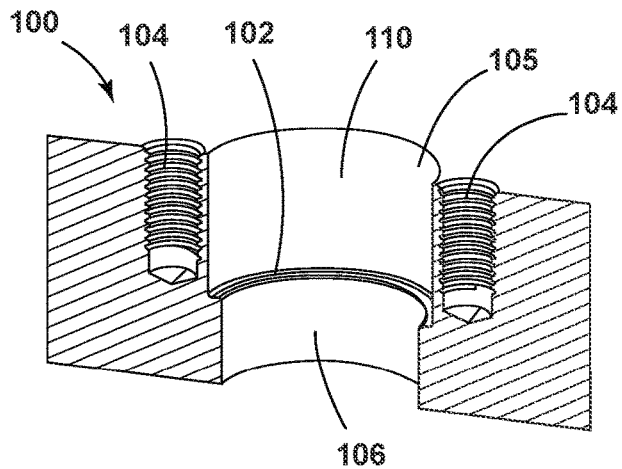
FIG. 13 is a partial, cross-sectional perspective view of machining of one of the die members.

The machining of die member 100 necessary to receive the guided keeper assembly 2 is simple. As illustrated in FIG. 13, an aperture 110 is formed in die member 100. The aperture 110 includes a wider portion 105 and a narrower portion 106, thereby creating an internal shoulder 102 in aperture 110. One or more fastener openings 104 are also machined in the die member 100, as illustrated in FIG. 13.

Figure 14:
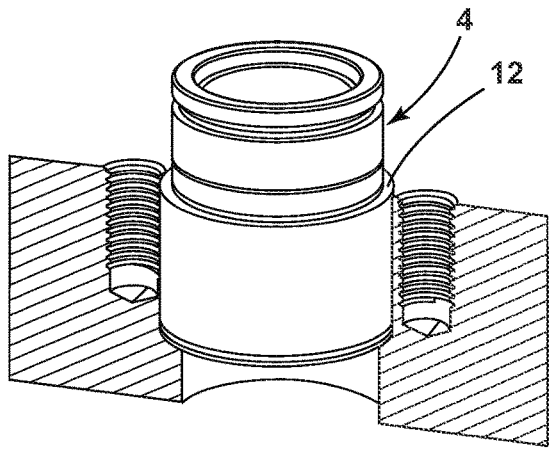
FIG. 14 is a partial, cross-sectional perspective view of one embodiment of a base positioned in the machined die member of FIG. 13.
Figure 15:
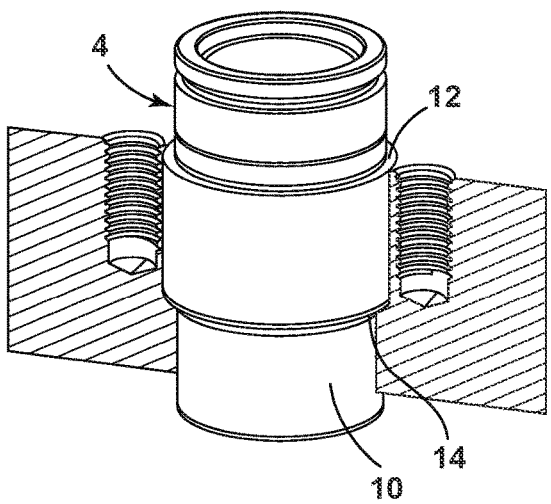
FIG. 15 is a partial, cross-sectional perspective view of another embodiment of a base shown in the machined die member of FIG. 13.

As illustrated in FIGS. 14 and 15, the first external shoulder 12 on base 4 will be generally flush with the top surface of the die member 100. The bottom side of the first portion 6 of base 4 will contact the internal shoulder 102 of the aperture 110 in die member 100, as illustrated in FIG. 14. If the base 4 includes a third portion 10, as illustrated in FIG. 15, the second external shoulder 14 will contact the internal shoulder 102 of the aperture 110 in die member 100.

Figure 17:
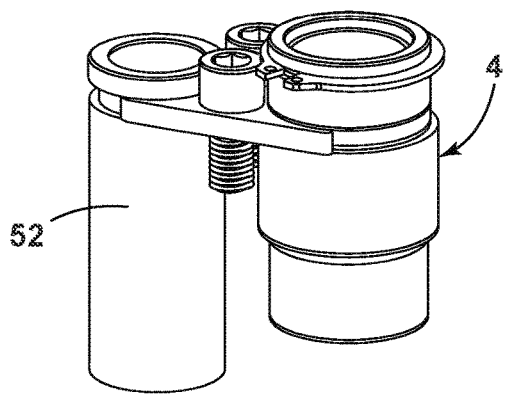
FIG. 17 is a perspective view of a base coupled to a gas spring can.

As illustrated in FIGS. 17, 18, and 19, the guided keeper assembly 2 can be used with a gas spring can 52 with a gas spring 54 in die members 100, 200. The converging position of die members 100 and 200 is shown in FIG. 18, and the diverging positions of die members 100 and 200 are illustrated in FIG. 19. As illustrated in FIGS. 18, 19, fasteners 60 can be used to secure the second end 84 of the guide pin 80 to die member 200.

Figure 21:
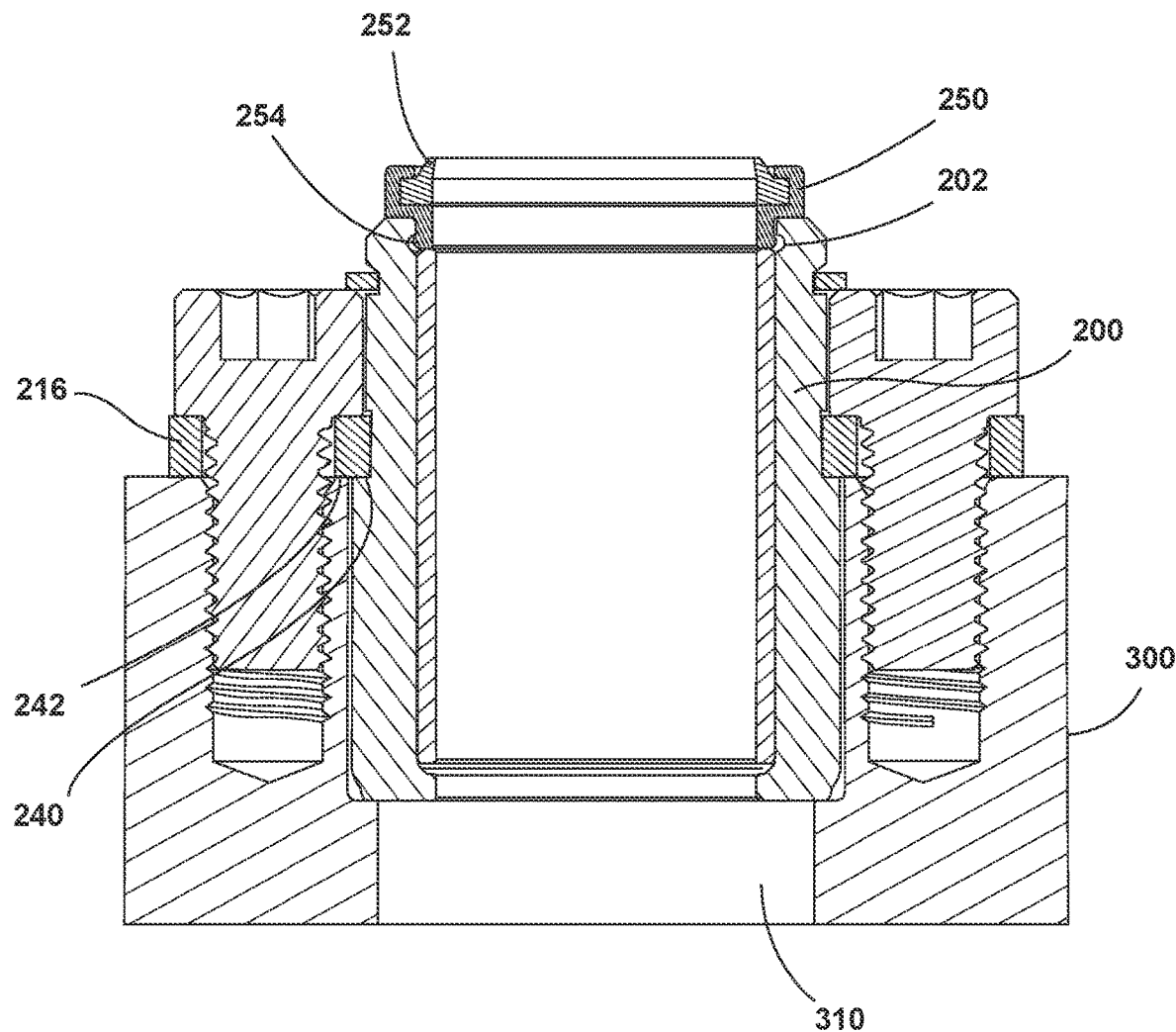
FIG. 21 is a cross-sectional view of the base shown in FIG. 20 with a wiper cap assembly.
Figure 22:
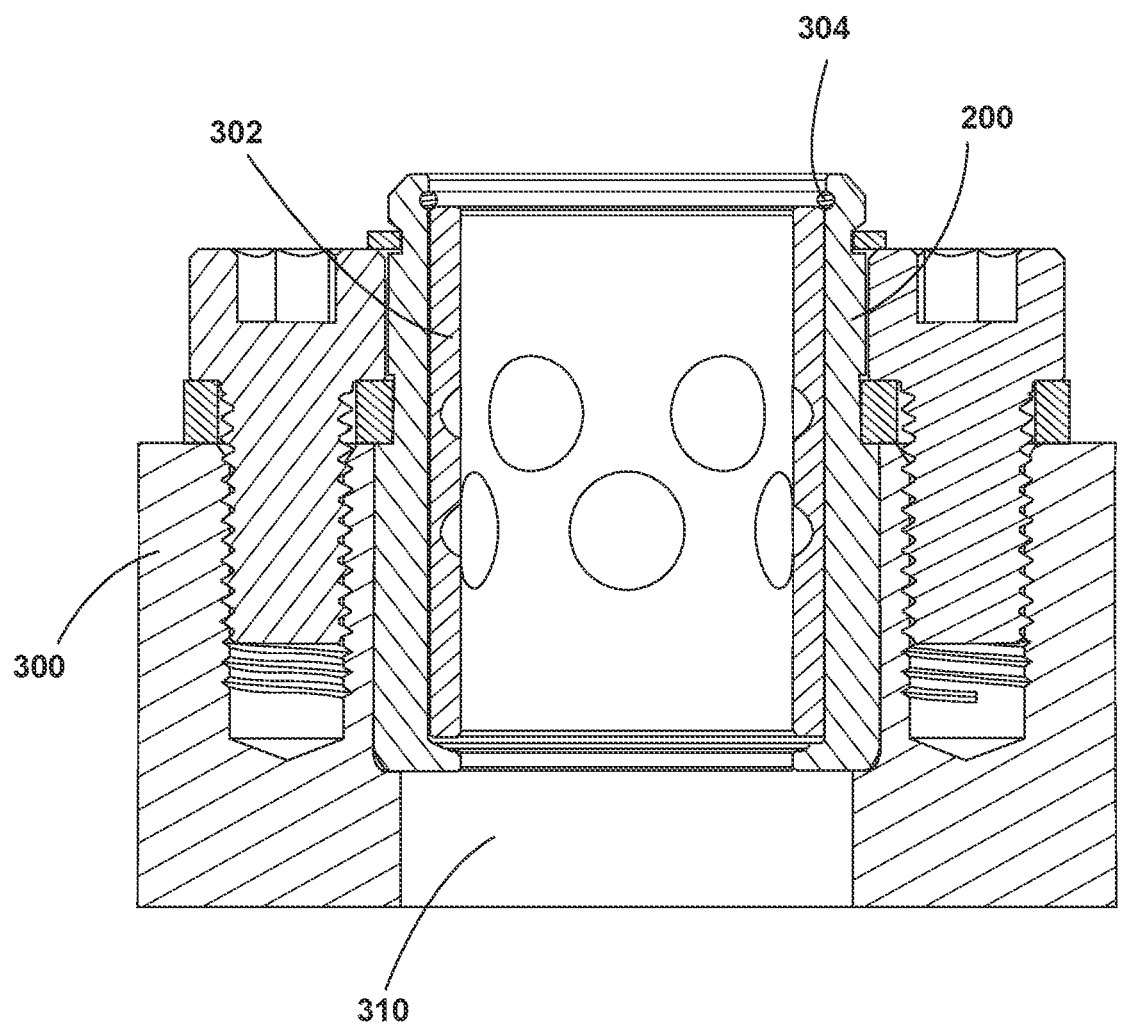
FIG. 22 is a cross-sectional view of the base shown in FIG. 20 with a different bushing.
Figure 23:
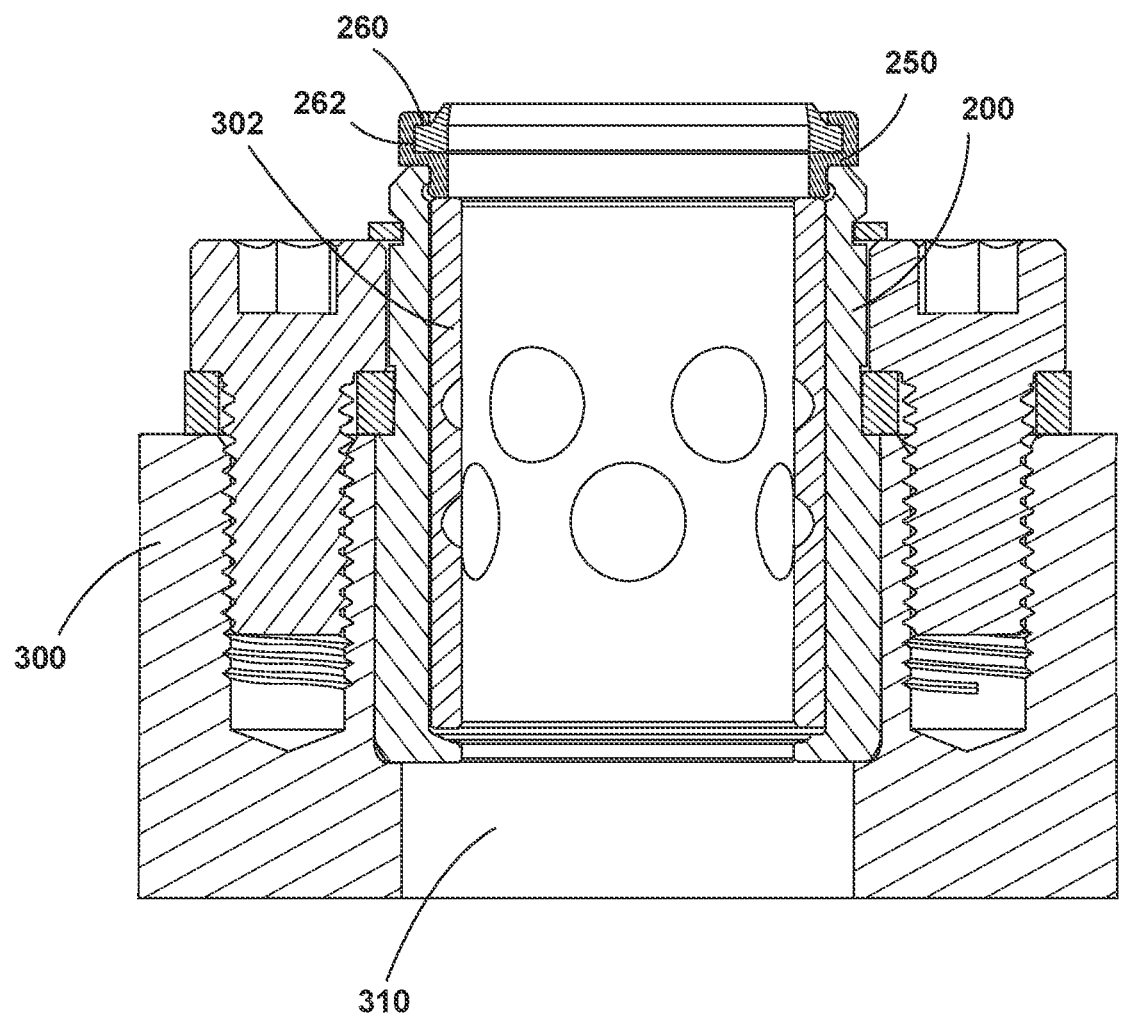
FIG. 23 is a cross-sectional view of the base and bushing shown in FIG. 22 with a wiper cap assembly.

An alternative embodiment of the base 201 is shown in FIGS. 20-23. The base 201 includes a groove 202 in the aperture 205 of base 201. A bushing 204 can be received within the aperture 205 of the base 201. The groove 202 can be used to couple a wiper cap assembly 250 to the base 201 as shown in FIGS. 21 and 23. The wiper cap assembly 250 includes a housing 251 that receives a rod wiper 252. The rod wiper 252 includes a section 257 that is received within a shaped surface 255 of the housing 251. The rod wiper 252 is made from a flexible material, such a rubber. The rod wiper 252 is designed to remove external fluids and debris from a rod that reciprocates within the base 201. The rod wiper 252 will compress against the exterior surface of the rod. The wiper cap housing 251 includes a flange portion 254 that is received in a groove 202 of base 201. The flange portion 254 can be continuous or intermittent.

The base 201 can be coupled to the die member 300 by the use of fasteners 245 that are received in openings in flange member 216. The flange member 216 can be one or more pieces and can be of any shape. The flange member 216 includes a surface 242 that rests on a surface of die member 300 and an opening 247 in between a lower surface 240 and upper surface 241 in base 201.

In the embodiments shown in FIGS. 20-23, the base 201 does not sit on an internal ledge in the bored hole 310 in die member 300. Instead, it is held in place by the flange member 216 contacting the surfaces of the die member 300 and the opening 247 in base 201.

An alternative bushing 302 is shown in FIGS. 22 and 23 with internal plugs 303. These plugs 303 can be made from a friction reducing material, such as a polymeric material, a coated material, a lubricated material, and/or graphite.

A ring 304 can be used in groove 202 of base 201 to contact a surface of the bushing 204/302, as illustrated in FIG. 22. This helps retain the bushing 204/302 in the base 201 when the wiper cap assembly 250 is not used.

In the foregoing description, it will be readily appreciated by those skilled in the art that modifications may be made to the invention without departing from the concepts disclosed herein. Such modifications are to be considered as included in the following claims, unless these claims by their language expressly state otherwise.

It will be understood by one having ordinary skill in the art that construction of the present disclosure and other components is not limited to any specific material. Other exemplary embodiments of the disclosure disclosed herein may be formed from a wide variety of materials, unless described otherwise herein.

For purposes of this disclosure, the term "coupled" or "operably coupled" (in all of its forms, couple, coupling, coupled, etc.) generally means the joining of two components (electrical or mechanical) directly or indirectly to one another. Such joining may be stationary in nature or movable in nature. Such joining may be achieved with the two components (electrical or mechanical) and any additional intermediate members being integrally formed as a single unitary body with one another or with the two components. Such joining may be permanent in nature or may be removable or releasable in nature unless otherwise stated.

For purposes of this disclosure, the term "connected" or "operably connected" (in all of its forms, connect, connecting, connected, etc.) generally means that one component functions with respect to another component, even if there are other components located between the first and second component, and the term "operable" defines a functional relationship between components.

It is also important to note that the construction and arrangement of the elements of the present disclosure as shown in the exemplary embodiments is illustrative only. Although only a few embodiments of the present innovations have been described in detail in this disclosure, those skilled in the art who review this disclosure will readily appreciate that, unless otherwise described, many modifications are possible (e.g., variations in sizes, dimensions, structures, shapes and proportions of the various elements, values of parameters, mounting arrangements, use of materials, colors, orientations, etc.) without materially departing from the novel teachings and advantages of the subject matter recited. For example, elements shown as integrally formed may be constructed of multiple parts or elements shown as multiple parts may be integrally formed, the operation of the interfaces may be reversed or otherwise varied, the length or width of the structures and/or members or connector or other elements of the system may be varied, the nature or number of adjustment positions provided between the elements may be varied. It should be noted that the elements and/or assemblies of the system may be constructed from any of a wide variety of materials that provide sufficient strength or durability, in any of a wide variety of colors, textures, and combinations. Accordingly, all such modifications are intended to be included within the scope of the present innovations. Other substitutions, modifications, changes, and omissions may be made in the design, operating positions, and arrangement of the desired and other exemplary embodiments without departing from the spirit of the present innovations.

It will be understood that any described processes or steps within described processes may be combined with other disclosed processes or steps to form structures within the scope of the present disclosure. The exemplary structures and processes disclosed herein are for illustrative purposes and are not to be construed as limiting.

It is also to be understood that variations and modifications can be made on the aforementioned structures and methods without departing from the concepts of the present invention, and further it is to be understood that such concepts are intended to be covered by the following claims unless these claims by their language expressly state otherwise.

The invention is claimed as follows:

1. A guided keeper assembly for a metal forming die having first and second die members mounted a spaced apart distance for reciprocation between converged and diverged positions, comprising:
    a base having:
        a generally cylindrical first portion with a first outside diameter, a generally cylindrical second portion with a second outside diameter which is less than said first outside diameter creating an external shoulder where said first portion and said second portion intersect;
        a tapered retainer ring groove on the exterior surface of said second portion;
        an aperture with a generally uniform first diameter and a smaller generally uniform second diameter forming an internal shoulder at the bottom of the aperture, said aperture extending axially into a portion of said base with an internal shoulder; and
        a groove located in said generally uniform first diameter of said aperture;
    at least one bushing with a first end portion and a second end portion positioned within said aperture;
    a guide pin having:
        a cylindrically shaped central portion closely received within said at least one bushing, said bushing having an external diameter that is larger than said second diameter of said aperture in said base;
        a first end having an enlarged head to abut said base adjacent to said internal shoulder of said aperture to positively limit travel between the first and second die members; and
        a second end that couples to one of the die members;
    a mounting flange member that includes at least one fastener opening, said mounting flange member abutting at least a portion of said external shoulder of said base;
    at least one fastener that is received through said at least one fastener opening in said mounting flange to couple said base to the other die member; and
    a retainer ring detachably received and securely retained in said retainer ring groove, said retainer ring having an interior face disposed over at least a portion of said at least one fastener to positively prevent said at least one fastener from unintentionally unfastening from said other die member.

2. The guided keeper assembly as set forth in claim 1, wherein said mounting flange member is a single piece.

3. The guided keeper assembly as set forth in claim 1, wherein said mounting flange member is multiple pieces.

4. The guided keeper assembly as set forth in claim 1, including at least two bushings positioned within said aperture in said base.

5. The guided keeper assembly as set forth in claim 1, wherein said at least one bushing includes graphite plugs.

6. The guided keeper assembly as set forth in claim 1, wherein said at least one bushing includes a bronze material.

7. The guided keeper assembly as set forth in claim 1, wherein said base includes a third portion that extends from said first portion with a third outside diameter that is less than said first outside diameter creating a second external shoulder where said first portion and said third portion intersect.

8. The guided keeper assembly as set forth in claim 7, wherein said internal shoulder in said aperture in said base is located on the portion of said aperture located within said third portion of said base.

9. The guided keeper assembly of claim 1, including a dampening member positioned between said enlarged head and said base.

10. A guided keeper assembly, comprising:
a base having:
a generally cylindrical first portion with a first outside diameter, a generally cylindrical second portion with a second outside diameter that is less than said first outside diameter creating a first external shoulder on said base;
a tapered retainer ring groove on the exterior surface of said second portion, said taper in the groove including a portion that tapers toward said first portion of said base, and said groove includes a generally cylindrical portion;
an aperture with a generally uniform first diameter and a smaller generally uniform second diameter forming an internal shoulder at the bottom of the aperture, said aperture extending into a portion of said base; and
a groove located in said generally uniform diameter of said aperture;
a bushing member with a first end portion and a second end portion position in said aperture in said base;
a guide pin having:
a cylindrically shaped central portion closely received inside said bushing member, said bushing having an external diameter that is larger than said second diameter of said aperture in said base;
a first end having an enlarged head to abut said base adjacent to said internal shoulder of said aperture; and
a second end positioned opposite said first end;
a mounting flange member that includes at least one fastener opening, said mounting flange member abutting at least a portion of said first external shoulder on said base;
at least one fastener that is received through said at least one fastener opening in said mounting flange member; and
a retainer ring detachably received in said retainer ring groove such that said retainer ring is disposed over said at least one fastener.

11. The guided keeper assembly of claim 10, wherein said bushing member is a plurality of bushings.

12. The guided keeper assembly of claim 10, further including a third portion on said base with a third outside diameter that is smaller than said first outside diameter thereby creating a second external shoulder on said base where said third portion and said first portion intersect.

13. The guided keeper assembly of claim 10, including a dampening member positioned between said enlarged head on said guide pin and said base.

14. The guided keeper assembly of claim 10, wherein said base is a unitary piece.

15. The guided keeper assembly of claim 10, including a ring that is positioned in a ring groove located on said second end of said guide pin.

16. A method of making a guided keeper assembly, comprising:
forming a base with a generally cylindrical first portion with a first outside diameter, a generally cylindrical second portion with a second outside diameter which is less than said first outside diameter creating an external shoulder where said first portion and said second portion intersect;
forming an aperture with a generally uniform first diameter and a smaller generally uniform second diameter forming an internal shoulder at the bottom of the aperture, said aperture being formed in a portion of said base;
forming a groove in said generally uniform first diameter of said aperture;
forming a tapered retainer ring groove on the exterior surface of said second portion of said base;
inserting at least one bushing into said aperture in said base;
forming a guide pin with a cylindrically shaped central portion that is closely received in said at least one bushing, said bushing having an external diameter that is larger than said second diameter of said aperture in said base, said guide pin having a first end with an enlarged head to abut said base adjacent to said internal shoulder of said aperture, and a second end;
inserting said guide pin into said at least one bushing;
positioning a mounting flange member having at least one fastener opening against said external shoulder;
positioning at least one fastener in said at least one fastener opening in said mounting flange; and
inserting a retainer ring into said retainer ring groove to be disposed over said at least one fastener.

17. The method of making a guided keeper assembly of claim 16, wherein said base forming step includes forming a generally cylindrical third portion with a third outside diameter that is less than said first outside diameter creating a second external shoulder on said base.

18. The method of making a guided keeper assembly of claim 16, wherein said mounting flange member is multiple pieces.

19. The method of making a guided keeper assembly of claim 16, including positioning a dampening member on said enlarged head.

20. The method of making a guided keeper assembly of claim 16, wherein multiple bushings are inserted into said aperture in said base.

* * * * *